United States Patent [19]

Watanabe et al.

[11] Patent Number: 5,720,010
[45] Date of Patent: Feb. 17, 1998

[54] CONTROL SYSTEM FOR A LINEAR ACTUATOR INCLUDING MAGNETIC BEARINGS FOR LEVITATING A ROBOT ARM

[75] Inventors: Katsuhide Watanabe, Kanagawa-ken; Yoichi Kanemitsu, Fukuoka-ken; Shinichi Moriyama, Fukuoka-ken; Naoji Hiraki, Fukuoka-ken, all of Japan

[73] Assignee: Ebara Corporation, Tokyo, Japan

[21] Appl. No.: 699,342

[22] Filed: Aug. 19, 1996

[30] Foreign Application Priority Data

Aug. 22, 1995 [JP] Japan ................. 7-236001

[51] Int. Cl.$^6$ ................. G05B 15/00; G05B 19/00
[52] U.S. Cl. ................. 395/93; 395/90; 395/86; 901/40; 901/47; 318/568.18; 414/744.6
[58] Field of Search ................. 395/93, 90, 86; 901/40, 47; 318/568.16

[56] References Cited

U.S. PATENT DOCUMENTS

| | | | |
|---|---|---|---|
| 5,023,533 | 6/1991 | Ishikawa | 318/568.21 |
| 5,049,797 | 9/1991 | Phillips | 318/568.16 |
| 5,179,516 | 1/1993 | Choshitani | 364/167.01 |
| 5,285,995 | 2/1994 | Gonzalez | 248/550 |
| 5,387,851 | 2/1995 | Nuscheler | 318/135 |
| 5,397,212 | 3/1995 | Watanabe et al. | 414/744.6 |

FOREIGN PATENT DOCUMENTS

| | | |
|---|---|---|
| 55-66204 | 5/1980 | Japan. |
| 2-114803 | 4/1990 | Japan. |

*Primary Examiner*—Tariq R. Hafiz
*Assistant Examiner*—Jeffrey S. Smith
*Attorney, Agent, or Firm*—Oblon, Spivak, McClelland, Maier & Neustadt, P.C.

[57] ABSTRACT

A control system for controlling a linear actuator including magnetic bearings for levitating a robot arm and a pulse motor for linearly driving the arm in a non-contact manner is disclosed, which comprises a displacement detection unit including displacement sensors, first and second calculation units, moving amount detection unit and adding circuit. The displacement detection unit detects displacement values of the arm from a reference posture, the first calculation unit calculates guiding (y), levitation (z), roll (p), pitching (q), and yaw (r) control current values in response to the displacement values and provides guiding, levitation, roll, pitching, and yaw control current signals ($\widehat{\Delta Iy}$, $\widehat{\Delta Iz}$, $\widehat{\Delta Ip}$, $\widehat{\Delta Iq}$, $\widehat{\Delta Ir}$). The moving amount detecting circuit detects a moving amount ($X_0$) of the arm from a reference position in response to an operation of the pulse motor, and provides a compensation current value ($\Delta Iq''$) proportional to the moving amount, and the adding circuit adds the compensation current value ($\Delta Iq''$) to the pitching control current signal ($\widehat{\Delta Iq}$). The second calculation unit, in response to the guiding, levitation, roll and yaw control current signals ($\widehat{\Delta Iy}$, $\widehat{\Delta Iz}$, $\widehat{\Delta Ip}$, $\widehat{\Delta Ir}$) and the added pitching control current signal ($\widehat{\Delta Iq}+\Delta Iq''$), calculates drive current control values to compensate drive current flowing through the magnetic bearings.

6 Claims, 10 Drawing Sheets

(FROM Fig.5(A))

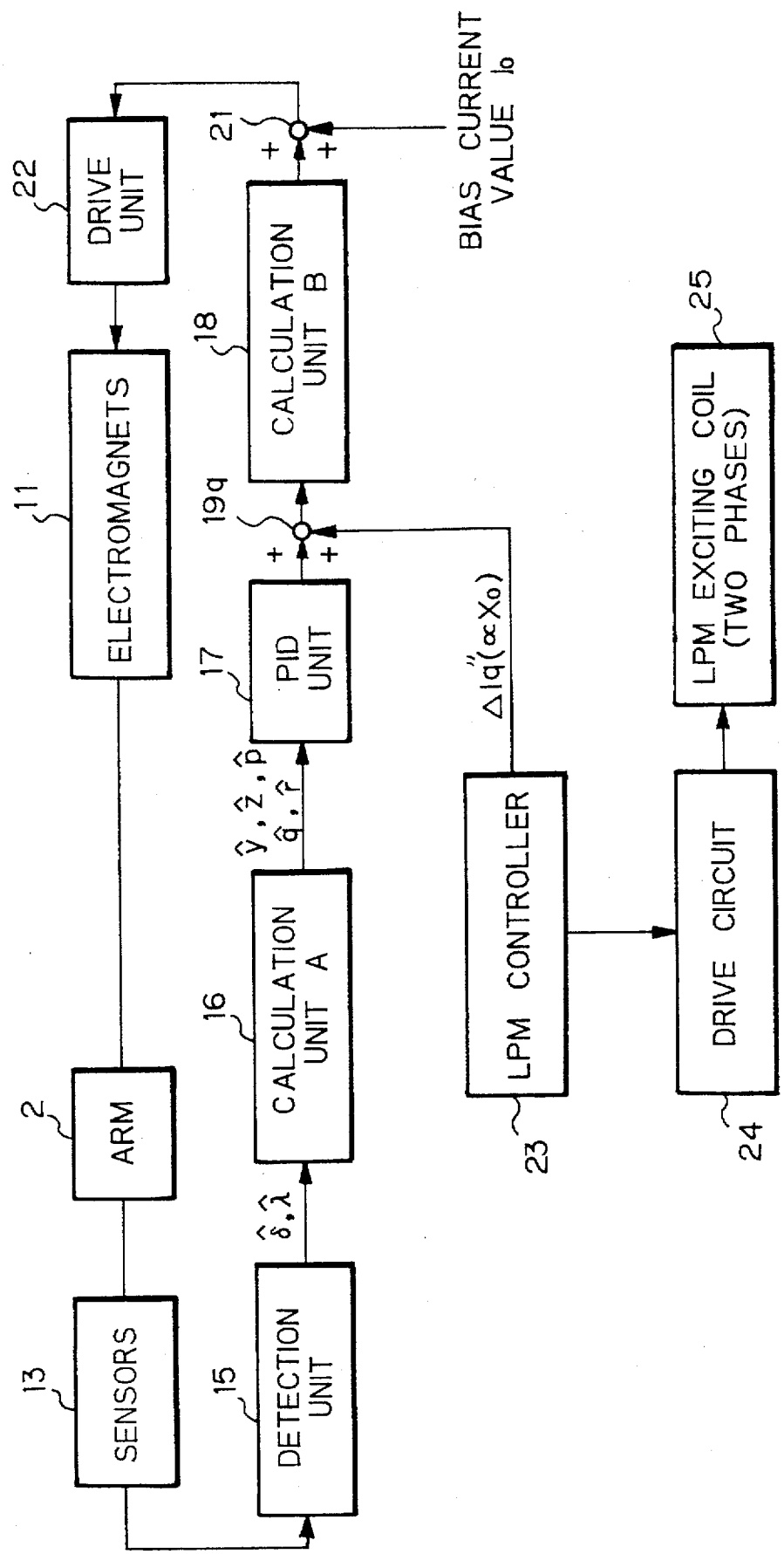

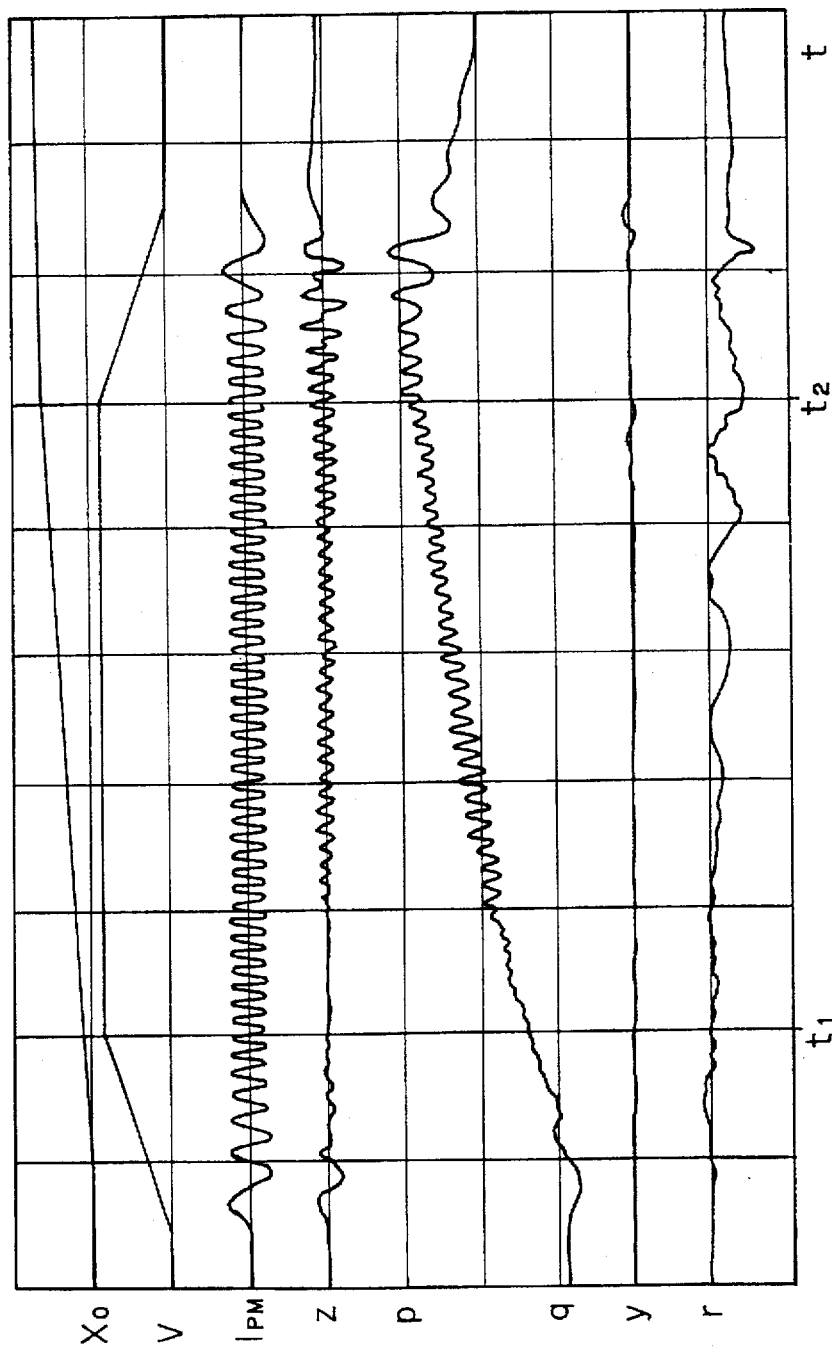
Fig. 7 WAVEFORMS OF CONTROL SIGNALS FOR RESPECTIVE POSTURE PARAMETERS DURING RUNNING WITHOUT FEED-FORWARD CONTROL FOR q

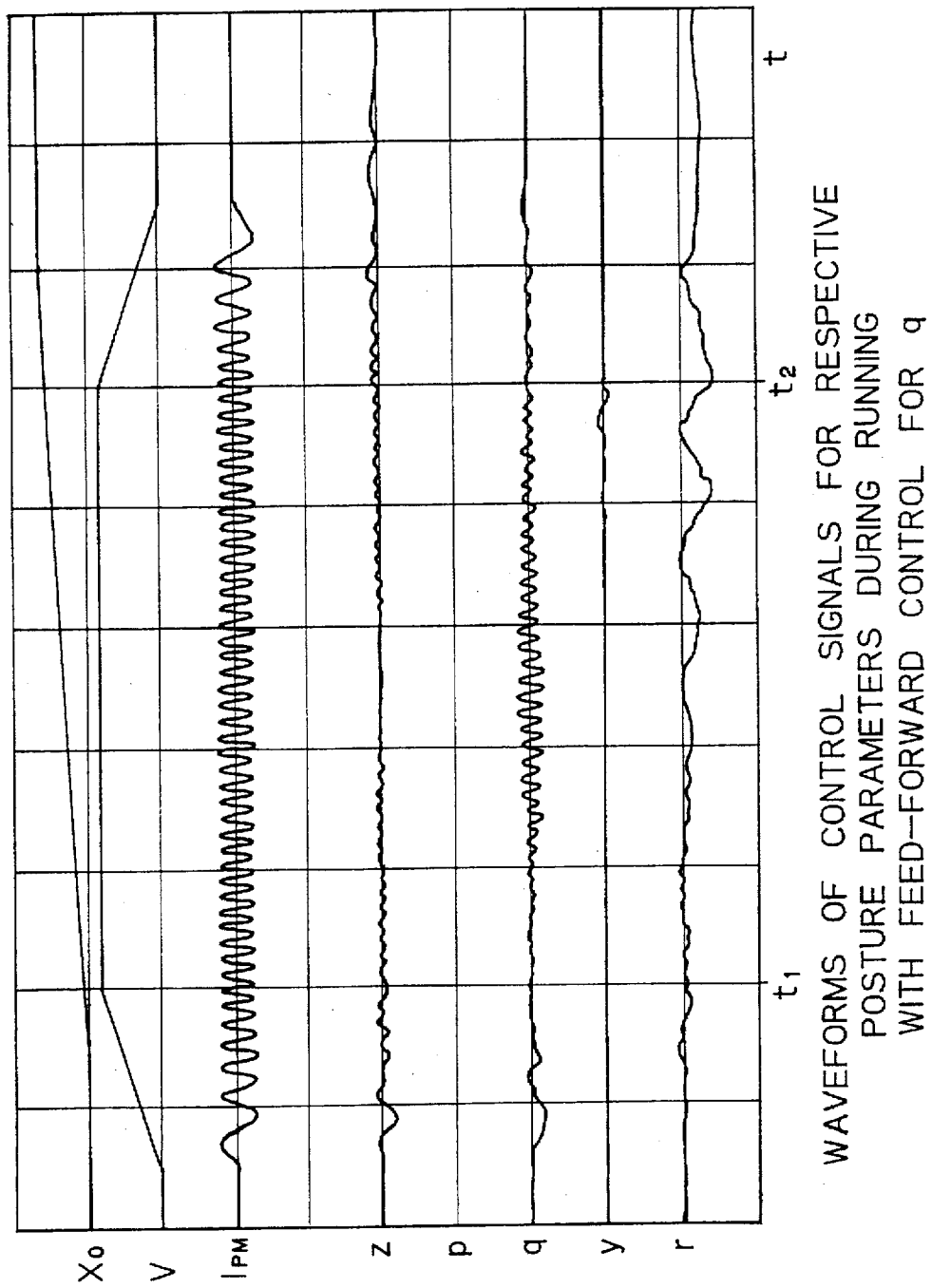

CONTROL SYSTEM FOR A LINEAR ACTUATOR INCLUDING MAGNETIC BEARINGS FOR LEVITATING A ROBOT ARM

BACKGROUND OF THE INVENTION

1. Field of the Invention

The present invention generally relates to a linear actuator for a robot arm, and more particularly to a system for controlling a levitation posture of a robot arm in a linear actuator by employing a magnetic levitation technology.

2. Description of the Prior Art

In semiconductor manufacturing processes, as line widths drawn on a semiconductor wafer are reduced to a submicron level, fine foreign particles on the wafer increasingly affect the yield of products, so that special attention should be paid to the presence of dust particles which may result in the contamination of the semiconductor wafer.

The elimination of dust particles is of course a requirement also in a robot system (or robot) which handles such semiconductor wafers. To completely meet this requirement, it is necessary to eliminate dust particles which might be collected by a lubricant used in the robot and stirred up by contact of a movement element of the robot with others. In order to satisfy the requirement, the inventors of the present invention and others have devised a clean robot which is equipped with a completely non-mechanical-contact (or non-contact) actuator using a magnetic bearing and a linear pulse motor and is operable in high vacuum environments. The clean robot is disclosed in U.S. Pat. No. 5,397,212 and the corresponding Japanese Pat. Public Disclosure (Kokai) No. 6-23687 (1994).

FIG. 1 illustrates the above-mentioned clean robot. The clean robot comprises a robot arm 2 having a hand 1 at a free end thereof, a linear actuator 3, a rotary actuator 5 and a vertical cylindrical casing 10 having an elevation mechanism 7 therein. The combination of the linear actuator 3 and rotary actuator 5 realizes three-dimensional movements of the robot arm 2 about the cylindrical casing 10.

The hand 1 carries an object to be transported, such as a semiconductor wafer or the like. The actuator 3 includes pulse motors for linearly driving the robot arm 2, magnetic bearings for supporting the robot arm 2 with non-contact levitation state which comprises four pairs of electromagnets, and a plurality of displacement sensors. In the magnetic bearings used in the actuator, two pairs of electromagnets respectively sandwich the right and left parts in a forward portion of the robot arm 2 in a non-contact state, while the other pairs of electromagnets respectively sandwich the right and left parts in a backward portion of the robot arm 2 in a non-contact state. By controlling the attractive forces of the electromagnets in response to the output of the displacement sensors, the levitated posture of the robot arm 2 is compensated.

The robot arm 2 is rendered so as to be linearly moved by the actuator 3, while the actuator is rotatably supported by the rotary actuator 5 in a non-contact state.

FIG. 2 illustrates six directions of posture control for the robot arm 2, in which "x" represents a running direction of the robot arm 2 driven by the pulse motors, and "y", "z", "p", "q", and "r" respectively represent a guiding direction, levitating direction, roll direction, pitching direction, and yaw direction controlled by the magnetic bearing. Accordingly, the magnetic bearing controls the levitated posture of the robot arm in five degrees of freedom.

In the prior actuator, as the robot arm 2 is moving away, since the centroid of the robot arm 2 moves away from the center of the linear actuator 3, the angle of the pitching direction "q" of the robot arm 2 becomes larger. In other words, as the centroid of the robot arm 2 moves away from the linear actuator 3, the hand 1 at the free end of the robot arm 2 goes down so that the robot arm 2 is inclined.

Further, since the linear robot arm 2 is made of an elongated thin plate, it vibrates in flexible modes with relatively low natural frequencies. Among the flexible modes, the natural frequencies of lower-order flexible modes are adjacent to a frequency band of a feedback control system, so that interference to the feedback control system for controlling the levitation posture of the robot arm 2 occurs, which causes the problem that the levitation posture of the robot arm cannot be controlled effectively. The magnetic bearings, therefore, are required to attenuate or eliminate such flexible vibrations of the robot arm 2.

SUMMARY OF THE INVENTION

It is an object of the present invention to provide a control system of a linear actuator which is capable of eliminating or reducing such an inclination problem of a robot arm driven by the actuator as described above.

It is another object of the present invention to provide a control system of a linear actuator which is capable of preventing a robot arm driven by the actuator from vibrating in lower-order flexible modes, thereby preventing a feedback control system from interference by the flexible variations.

In order to attain the first object of the invention, a control system for controlling a linear actuator according to the present invention, wherein the actuator includes a plurality of magnetic bearings for levitating and supporting a robot arm and a pulse motor for linearly driving the robot arm in a non-contact manner, comprises:

displacement detection means for detecting displacement values of said robot arm from a reference posture:

first calculation means, in response to said displacement values, for calculating guiding (y), levitation (z), roll (p), pitching (q), and yaw (r) control current values and providing guiding, levitation, roll, pitching, and yaw control current signals ($\widehat{\Delta Iy}$, $\widehat{\Delta Iz}$, $\widehat{\Delta Ip}$, $\widehat{\Delta Iq}$, $\widehat{\Delta Ir}$);

moving amount detecting means for detecting a moving amount ($X_o$) of said robot arm from a reference position in response to an operation of said pulse motor, and providing a compensation current value ($\Delta Iq''$) proportional to said moving amount;

adding means for adding said compensation current value ($\Delta Iq''$) to said pitching control current signal ($\widehat{\Delta Iq}$); and second calculation means, in response to said guiding, levitation, roll and yaw control current signals ($\widehat{\Delta Iy}$, $\widehat{\Delta Iz}$, $\widehat{\Delta Ip}$, $\widehat{\Delta Ir}$) and the added pitching control current signal ($\widehat{\Delta Iq}+\Delta Iq''$), for calculating drive current control values to compensate drive current flowing through said magnetic bearings, whereby a control for the pitching direction is executed in accordance with said moving amount of said robot arm to prevent said robot arm from inclination caused by the movement of said robot arm.

In order to attain the second object of the present invention, a control system for controlling a linear actuator according to the present invention, wherein the actuator includes a plurality of magnetic bearings for levitating and supporting a robot arm having a hand at one end thereof and a pulse motor for linearly driving the robot arm, comprises:

displacement detection means for detecting displacement values of said robot arm from a reference posture;

first calculation means, in response to said displacement values, for calculating guiding (y), levitation (z), roll (p), pitching (q), and yaw (r) control current values and providing guiding, levitation, roll, pitching, and yaw control current signals ($\widehat{\Delta y}$, $\widehat{\Delta z}$, $\widehat{\Delta p}$, $\widehat{\Delta q}$, $\widehat{\Delta r}$);

notch filter means for attenuating frequencies contained in the levitation, roll, pitching control current signals ($\widehat{\Delta z}$, $\widehat{\Delta p}$, $\widehat{\Delta q}$), the frequencies corresponding to the flexible natural variation frequencies of said robot arm in a running (x) direction; and second calculation means, in response to said guiding and yaw control current signals ($\widehat{\Delta y}$, $\widehat{\Delta r}$) and the filtered levitation, roll and pitching control current signals ($\widehat{\Delta z}$, $\widehat{\Delta p}$, $\widehat{\Delta q}$), for calculating drive current control values to compensate drive current flowing through said magnetic bearings, whereby the flexible natural variations of said robot arm is prevented from excitation.

In the preferred embodiment of the present invention, the magnetic bearings comprises four pairs of upper and lower electromagnets positioned at front-right front-left, back-right and back-left portions which sandwich the robot arm in non-contact states, and the displacement detection means comprises four pairs of upper and lower displacement sensors positioned near to the electromagnets for sensing gap and stagger lengths between the robot arm and the electromagnets, and calculation means in response to the gap and stagger lengths, for calculating displacement values in the guiding and levitation directions at the portions of the robot arm where the front and back electromagnets face.

BRIEF DESCRIPTION OF THE DRAWINGS

FIG. 6 shows a block diagram of the control system shown in FIGS. 5(A) and 5(B) in view of another aspect, for explaining a feed-forward control operation thereof according to the present invention;

FIG. 7 is a graph illustrating waveforms representing posture parameter values which were obtained by driving a robot arm by a linear actuator without the feed-forward control shown in FIG. 6, together with arm position and running speed values of the robot arm and a current value flowing pulse motors of the linear actuator;

FIG. 8 is a graph illustrating waveforms representing posture parameters which were obtained by driving the robot arm by a linear actuator with the feed-forward control shown in FIG. 6, together with the arm position and running speed values of the robot arm and a current value flowing pulse motors of the linear actuator;

DESCRIPTION OF THE PREFERRED EMBODIMENTS

Figure 1:
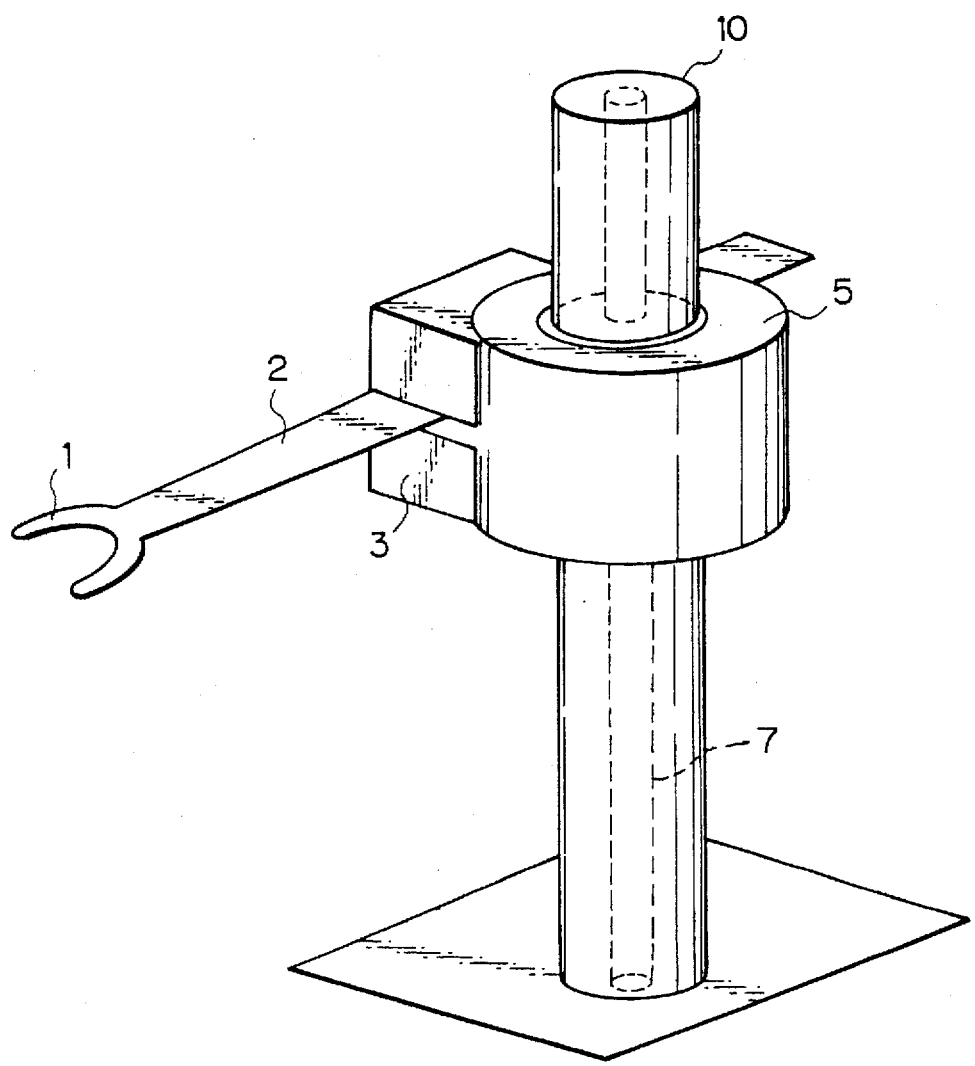
FIG. 1 illustrates a perspective view of a conventional vacuum clean robot.
Figure 2:
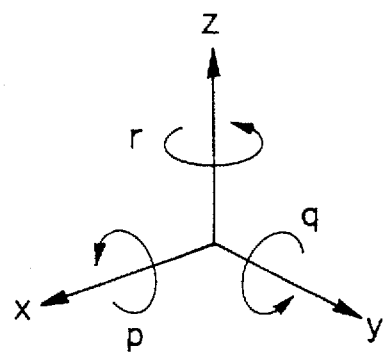
FIG. 2 shows a diagram for explaining the directions of six degrees of freedom to control a robot arm of the robot shown in FIG. 1.

Now, an embodiment of the present invention will hereinafter be described with reference to the accompanying FIGS. 3–10 as well as FIG. 2. In FIGS. 3–10, the same reference numerals and symbols as those in FIGS. 1 and 2 denote the same elements and directions as those in FIGS. 1 and 2.

Figure 3:
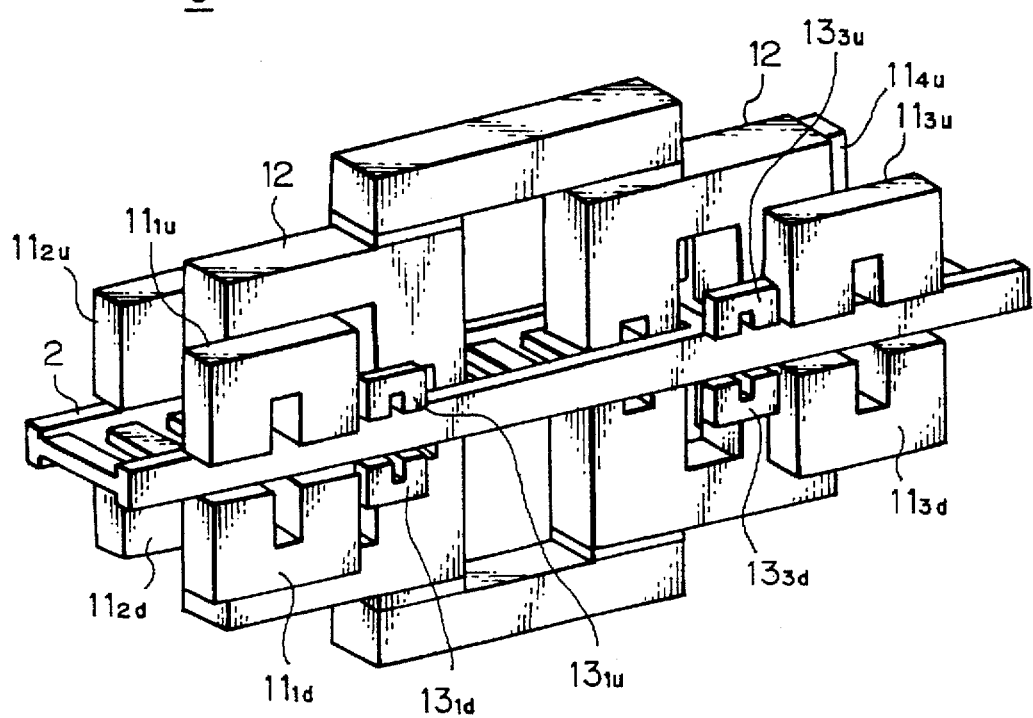
FIG. 3 illustrates a perspective view of a structure of a linear actuator to which a control system according to the present invention is applicable.

FIG. 3 illustrates a structure of a linear actuator 3 to linearly move a robot arm 2 to which a control system of the present invention is applicable. As explained relating to the prior art shown in FIG. 1, the actuator 3 is mounted to a rotary actuator whereby the robot arm 2 is capable of moving in three dimensions. The linear actuator 3 includes magnetic bearings comprising four pairs of upper and lower (down) electromagnets $11_{1u}$–$11_{4u}$ and $11_{1d}$–$11_{4d}$ for supporting the robot arm 2 with non-contact levitation and four pairs of non-contact displacement sensors $13_{1u}$–$13_{4u}$ and $13_{1d}$–$13_{4d}$, and linear pulse motors 12 for linearly moving the robot arm 2 in the running direction "r". In FIG. 3, the electromagnet $11_{4d}$ and two pairs of the displacement sensors $13_{2u}$, $13_{2d}$ and $13_{4u}$, $13_{4d}$ are hidden behind other components, and therefore are not illustrated therein.

Figure 4:
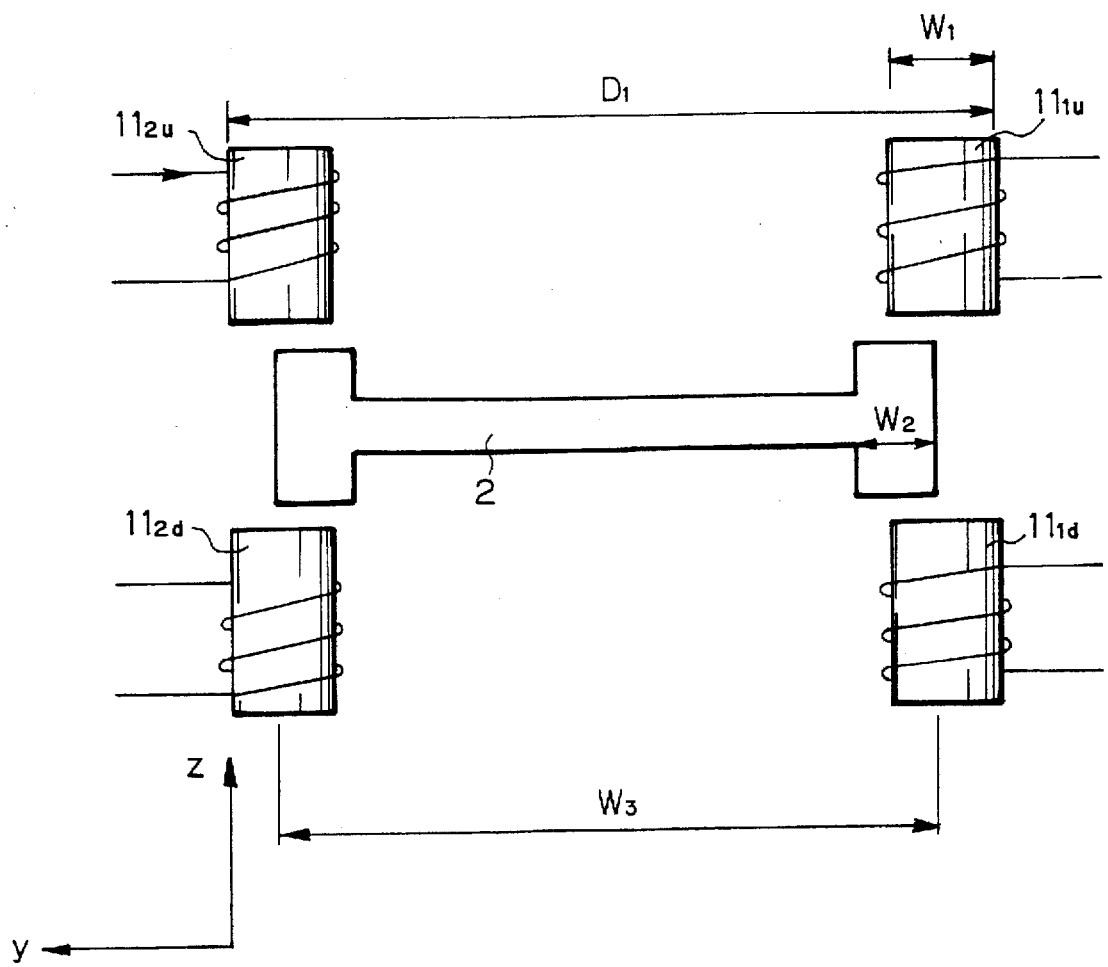
FIG. 4 is a cross-sectional view illustrating a positional relationship between robot arm and electro-magnets in the linear actuator shown in FIG. 3.

FIG. 4 shows a cross-sectional view of the front pairs of the electromagnets $11_{1u}$, $11_{1d}$ and $11_{2u}$, $11_{2d}$ as well as the robot arm 2. A cross-sectional view regarding the back pairs of the electromagnets $11_{3u}$, $11_{3d}$ and $11_{4u}$, $11_{4d}$ is representable similar to that in FIG. 4. A control force in the guiding direction "y", which is orthogonal to the levitating direction "z" is produced by employing the electromagnets in which the width $W_1$ of the electromagnets is larger than the width $W_2$ of the side ridges of the arm 2 and the distance $D_1$ between the outsides of the electromagnet pair is larger than the width $W_3$ of the robot arm 2, as shown in FIG. 4.

In the magnetic bearings used in the actuator 3, as shown in FIGS. 3 and 4, two pairs of the electromagnets $11_{1u}$, $11_{1d}$ and $11_{2u}$, $11_{2d}$ are positioned at the right and left sides in the front portion of the actuator 3 and respectively sandwich the right and left ridges of the robot arm 2 in non-contact states, while the other pairs of the electromagnets $11_{3u}$, $11_{3d}$ and $11_{4u}$, $11_{4d}$ are positioned at right and left sides in the back portion of the actuator 3 and respectively sandwich the right and left ridges of the robot arm 2 in non-contact states.

The displacement sensors $13_{1u}$–$13_{4u}$ and $13_{1u}$–$13_{4d}$ are respectively positioned near to the electromagnets $11_{1u}$–$11_{4u}$ and $11_{1d}$–$11_{4d}$ as shown in FIG. 3 and the respective pairs thereof sandwich the robot arm 2 in non-contact states. By controlling the attractive forces of the electromagnets in response to output signals from the displacement sensors, a levitated posture of the robot arm 2 is compensated.

Figure 5A:
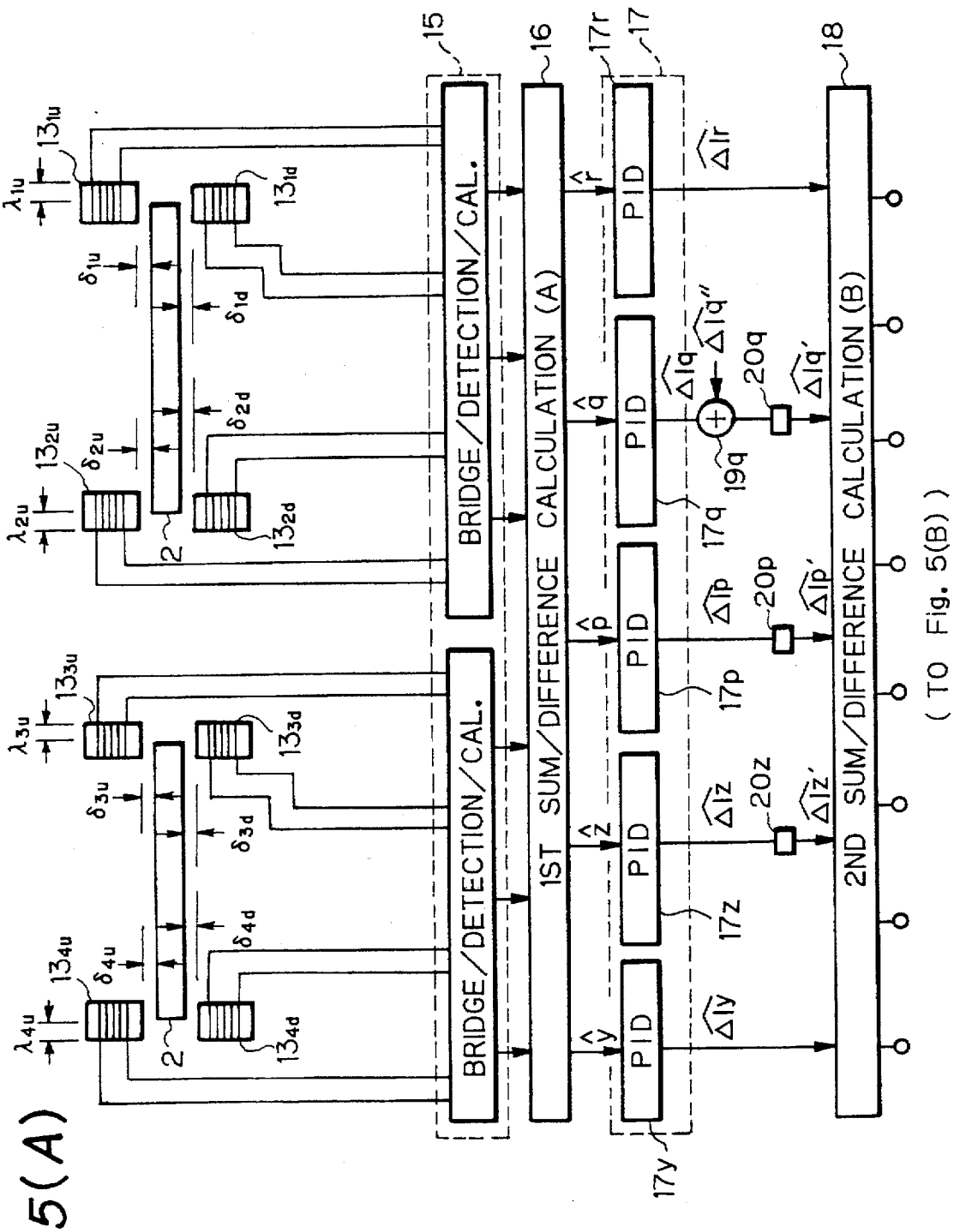
FIGS. 5(A) and 5(B) show, with a combination thereof, a block diagram of an embodied control system for controlling the electromagnets of the linear actuator, according to the present invention.
Figure 5B:
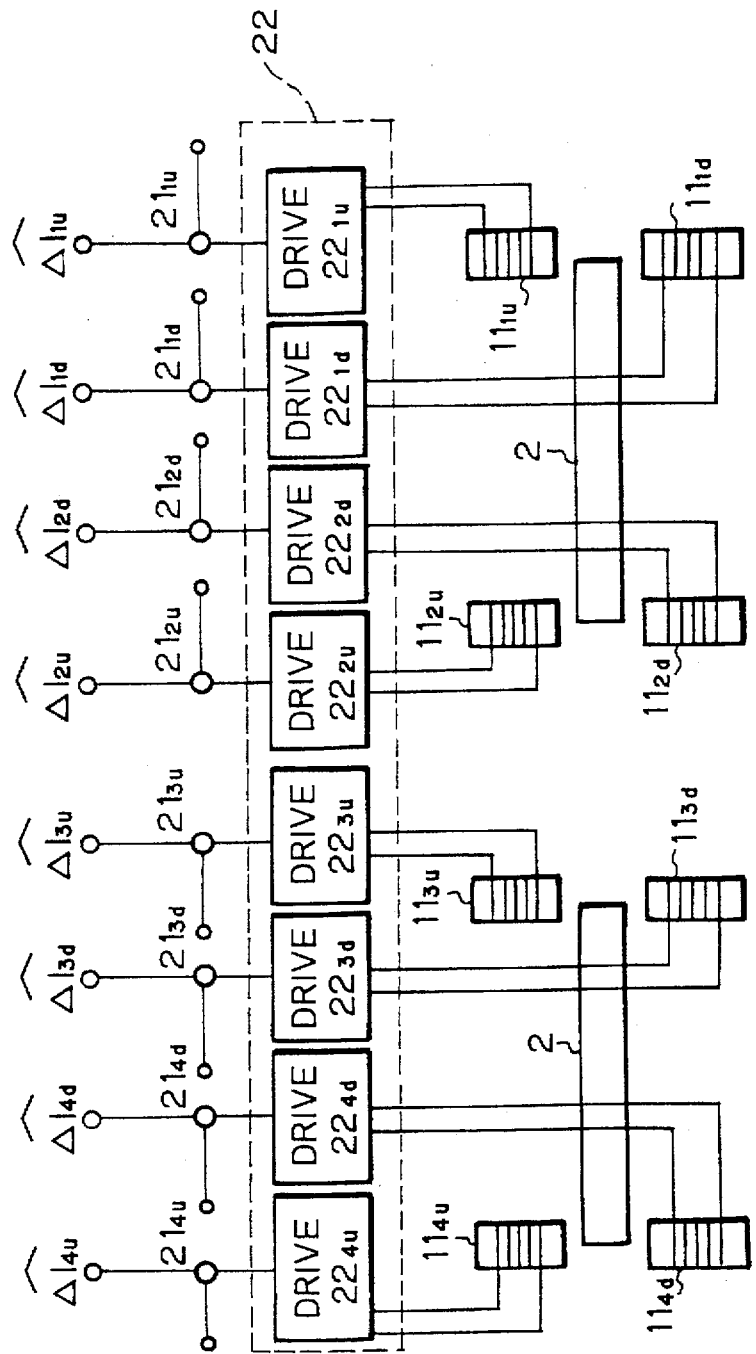

FIGS. 5(A) and 5(B) illustrate a block diagram of a control system which controls the levitation posture of the robot arm 2 by controlling current values flowing through the electromagnets $11_{1u}$–$11_{4u}$ and $11_{1u}$–$11_{4d}$ of the linear actuator 3, according to the present invention. The control system includes a displacement detection unit 15 and a first sum/difference calculation unit 16, a PID unit 17 consisting of five PID circuits 17y, 17z, 17p, 17q, 17r, a second sum/difference calculation unit 18, a first adding circuit 19q and notch filters 20z, 20p, 20q, as illustrated in FIG. 5(A).

The displacement detection unit 15 comprises a pair of bridge circuits, detection circuits and sum/difference calculation circuits. The displacement detection unit 15 receives the output signals from the displacement sensors $13_{1u}$–$13_{4u}$ and $13_{1d}$–$13_{4d}$, and in response to the signals, calculates differences $\Delta\delta_1$–$\Delta\delta_4$ between gap lengths $\delta_{1u}$–$\delta_{4u}$ and $\delta_{1d}$–$\delta_{4d}$ which are distances between the corresponding electromagnets and the upper and lower surfaces of the robot arm 2 in z-direction, and a difference $\Delta\lambda_f$ (suffix "f" means "front") between stagger lengths $\lambda_1$ and $\lambda_2$ and a difference $\Delta\lambda_b$ (suffix "b" means "back") between $\lambda_3$ and $\lambda_4$, wherein $\lambda_1$–$\lambda_4$ are distances between outside ends of the arm 2 and outside ends of the corresponding electromagnets in y-direction. It should be noted that although the sensors senses gap and stagger lengths from itself to the robot arm 2, the gap and stagger lengths coincides with those from the electromagnets to the robot arm because the sensors are positioned adjacent to the electromagnets.

The obtained differences $\Delta\delta_1$–$\Delta\delta_4$, $\Delta\lambda_f$ and $\Delta\lambda_b$ are then provided to the first sum/difference calculation unit 16, where they are used to obtain control amount values of the respective directions "y", "z", "p", "q", and "r" as control parameters. In FIG. 5(A), "ŷ", "ẑ", "p̂", "q̂", and "r̂" denote signals from the calculation units 16, which are functions of the control parameters "y", "z", "p", "q", and "r" according to time.

The signals from the calculation unit 16 are supplied to the corresponding PID circuits 17y, 17z, 17p, 17q, and 17r. The respective PID circuits produce feedback control current amount values $\Delta$Iy, $\Delta$Iz, $\Delta$Ip, $\Delta$Iq, and $\Delta$Ir for the respective directions. Similarly, in FIG. 5(A), $\widehat{\Delta Iy}$, $\widehat{\Delta Iz}$, $\widehat{\Delta Ip}$, $\widehat{\Delta Iq}$, and $\widehat{\Delta Ir}$ denote signals output from the PID circuits, which are functions of the control amount values $\Delta$Iy, $\Delta$Iz, $\Delta$Ip, $\Delta$Iq, and $\Delta$Ir according to time. These control current signals in the respective directions are supplied to the second sum/difference calculation circuit 18, to calculate current control values $\Delta L_{1u}$–$L_{4u}$ and $\Delta I_{1d}$–$\Delta I_{4d}$ for the electromagnets $11_{1u}$–$11_{4u}$ and $11_{1d}$–$11_{4d}$, provided that the q-control current signal $\Delta$Iq is supplied thereto through the adding circuit 19q and the notch filter 20q, and that the z and p-control current signals $\Delta$Iz and $\Delta$Ip are supplied thereto through the notch filters 20z and 20p. Similarly, in FIG. 5(A), $\widehat{\Delta I}_{1u}$–$\widehat{\Delta I}_{4u}$ and $\widehat{\Delta I}_{1d}$–$\widehat{\Delta I}_{4d}$ denote current control signals output from the calculation unit 18, which are functions of the current control values $\Delta I_{1u}$–$\Delta I_{4u}$ and $\Delta I_{1d}$–$\Delta I_{4d}$ according to time.

Referring to FIG. 5(B), the control system further includes a bias current value adding unit 21 consisting of adding circuits $21_{1u}$–$21_{4u}$ and $21_{4u}$–$21_{4d}$ which adds the current control signals $\widehat{\Delta I}_{1u}$–$\widehat{\Delta I}_{4u}$ and $\widehat{\Delta I}_{1d}$–$\widehat{\Delta I}_{4d}$ from the calculation circuit 18 and bias current values $I_{01u}$–$I_{04d}$ and $I_{01d}$–$I_{04d}$, respectively. The bias current values include a compensation value $\Delta I_0$, which is proportional to the mass "m" of the robot arm 2, thereby it is capable of canceling the weight of the arm itself.

The added current signals (or biased current value signals) are then provided to a drive unit 22 including drive circuits $22_{1u}$–$22_{4u}$ and $22_{1d}$–$22_{4d}$ to drive coils of the corresponding electromagnets $11_{1u}$–$11_{4u}$ and $11_{1d}$–$11_{4d}$ with currents having the biased current values.

It should be noted that for effectively implementing the separate controls for the respective modes (or directions "y", "z", "p", "q", and "r") to regulate the posture of the arm having a rigid body, it is important to match the characteristics of the used sensors and the electromagnets to achieve a linear control system and to prevent interference in the system.

The displacement detection unit 15 calculates the differences $\Delta\delta_1$–$\Delta\delta_4$ and $\Delta\lambda_f$ and $\Delta\lambda_b$ in accordance with the following Equations:

$$\Delta\delta_1 = (\delta_{1u} - \delta_{1d})/2 = \delta_{1u} - \delta_0 = \delta_0 - \delta_{1d} \quad (1)$$

$$\Delta\delta_2 = (\delta_{2u} - \delta_{2d})/2 = \delta_{2u} - \delta_0 = \delta_0 - \delta_{2d} \quad (2)$$

$$\Delta\delta_3 = (\delta_{3u} - \delta_{3d})/2 = \delta_{3u} - \delta_0 = \delta_0 - \delta_{3d} \quad (3)$$

$$\Delta\delta_4 = (\delta_{4u} - \delta_{4d})/2 = \delta_{4u} - \delta_0 = \delta_0 - \delta_{4d} \quad (4)$$

$$\Delta\lambda_f = (\lambda_2 - \lambda_1)/2 = \lambda_2 - \lambda_0 = \lambda_0 - \lambda_1 \quad (5)$$

$$\Delta\lambda_b = (\lambda_4 - \lambda_3)/2 = \lambda_4 - \lambda_0 = \lambda_0 - \lambda_3 \quad (6)$$

where $\delta_0$; a reference value at a balanced state $\lambda_0$; a reference value at a balanced state The sum/difference calculation unit 16 calculates the parameter values "y", "z", "p", "q" and "r" in accordance with the following Equations and provide them as the control signals ŷ, ẑ, p̂, q̂ and r̂:

$$y = -(\Delta\lambda_b + \Delta\lambda_f)/2 \quad (7)$$

$$z = -(\Delta\delta_4 + \Delta\delta_3 + \Delta\delta_2 + \Delta\delta_1)/4 \quad (8)$$

$$p = -(\Delta\delta_4 - \Delta\delta_3 + \Delta\delta_2 - \Delta\delta_1)/4 \quad (9)$$

$$q = -(\Delta\delta_4 + \Delta\delta_3 - \Delta\delta_2 - \Delta\delta_1)/4 \quad (10)$$

$$r = -(\Delta\lambda_b - \Delta\lambda_f)/2 \quad (11)$$

The PID circuits 17y, 17z, 17p, 17q and 17r create the signals $\widehat{\Delta Iy}$, $\widehat{\Delta Iz}$, $\widehat{\Delta Ip}$, $\widehat{\Delta Iq}$ and $\widehat{\Delta Ir}$ in accordance with the control signals ŷ, ẑ, p̂, q̂ and r̂ and provide them to the second sum/difference calculation unit 18 where the following Equations are calculated:

$$\widehat{\Delta I}_{1u} = (-\widehat{\Delta Iy} - \widehat{\Delta Ir} + \widehat{\Delta Iz}' - \widehat{\Delta Ip}' + \widehat{\Delta Iq}')/2 \quad (12)$$

$$\widehat{\Delta I}_{1d} = (-\widehat{\Delta Iy} - \widehat{\Delta Ir} - \widehat{\Delta Iz}' + \widehat{\Delta Ip}' + \widehat{\Delta Iq}')/2 \quad (13)$$

$$\widehat{\Delta I}_{2u} = (\widehat{\Delta Iy} + \widehat{\Delta Ir} + \widehat{\Delta Iz}' + \widehat{\Delta Ip}' - \widehat{\Delta Iq}')/2 \quad (14)$$

$$\widehat{\Delta I}_{2d} = (\widehat{\Delta Iy} + \widehat{\Delta Ir} - \widehat{\Delta Iz}' - \widehat{\Delta Ip}' + \widehat{\Delta Iq}')/2 \quad (15)$$

$$\widehat{\Delta I}_{3u} = (-\widehat{\Delta Iy} + \widehat{\Delta Ir} + \widehat{\Delta Iz}' - \widehat{\Delta Ip}' + \widehat{\Delta Iq}')/2 \quad (16)$$

$$\widehat{\Delta I}_{3d} = (-\widehat{\Delta Iy} + \widehat{\Delta Ir} - \widehat{\Delta Iz}' + \widehat{\Delta Ip}' - \widehat{\Delta Iq}')/2 \quad (17)$$

$$\widehat{\Delta I}_{4u} = (\widehat{\Delta Iy} - \widehat{\Delta Ir} + \widehat{\Delta Iz}' + \widehat{\Delta Ip}' + \widehat{\Delta Iq}')/2 \quad (18)$$

$$\widehat{\Delta I}_{4d} = (\widehat{\Delta Iy} - \widehat{\Delta Ir} - \widehat{\Delta Iz}' - \widehat{\Delta Ip}' - \widehat{\Delta Iq}')/2 \quad (19)$$

In Equations (12)–(19), $\widehat{\Delta Iz}'$ and $\widehat{\Delta Ip}'$ represent signals which are obtained by filtering signals $\widehat{\Delta Iz}$ and $\widehat{\Delta Ip}$ at the notch filters 20z and 20p, and $\widehat{\Delta Iy}'$ represents a signal which is obtained by adding $\Delta$Iq" to the signal $\widehat{\Delta Iq}$ at the adding circuit 19q and then by filtering it at the notch filter 20q.

Next, reduction of the interferences by the mass weight of the arm 2, which increases as the value $X_O$ increases, will be explained. FIG. 6 shows a block diagram for explaining an operation and effect of the adding circuit 19q in the embodiment shown in FIG. 5(A). The adding circuit 19q is inserted therein to combine a feed-forward control with the feedback control. As explained above, the detection circuit 15 detects the stagger length differences $\Delta_y$ and $\Delta\lambda_b$, and the gap length differences $\Delta\delta_1 - \Delta\delta_4$ in response to the signals provided from the displacement sensors, and the sum/difference calculation unit 16 creates the model control signals ŷ, ẑ, p̂, q̂, and r̂, on the basis of the signals $\Delta\lambda_f$, $\Delta\lambda_b$ and $\Delta\delta_1-\Delta\delta_4$. Then, the control signals are respectively induced to the PID unit 17 where the feedback control values $\Delta$Iy, $\Delta$Iz, $\Delta$Ip, $\Delta$Iq, and $\Delta$Ir are calculated, as described above.

The adding circuit 19q adds the feedback control signal $\Delta\hat{Iq}$ and a compensation value $\Delta$Iq" which is proportional to an arm position value $X_O$ representing the position of the arm in the running direction "x" (or the origin point of the coordinates of travel), which is provided from a linear pulse motor (LPM) controller. Since the LPM controller 23 controls a pulse motor drive circuit 24 to send drive pulses to the linear pulse motors 12 (FIG. 3) for linearly driving the robot arm 2, the controller 23 can easily calculate the arm position value $X_O$.

The control characteristics of a robot arm levitation control system were measured when the arm was moved over a range of ±0.2 m by linear motors with the feedback and feed-forward control shown in FIG. 6 (with feed-forward control) and with only the feedback control (without feed-forward control). The feed-forward control means that the adding circuit 19q is not employed in the control system. FIGS. 7 and 8 respectively illustrate the results of the measurement of the parameter values "y", "z", "p", "q" and "r" without and with the feed-forward control, together with the arm position values $X_O$, arm speed in the x-direction and current value $I_{PM}$ supplied to the pulse motors 12. That is, FIG. 8 illustrates the results of the measurement of the parameter values wherein $\Delta$Iq" ($\alpha X_O$) from the linear pulse motor controller 23 was fed to the q-control feedback system to execute the feed-forward control, while FIG. 7 illustrates the results of the measurement wherein the feed-forward control was removed and only the feedback control was executed.

As can be seen from FIG. 7, in the time period $t_1-t_2$ during which the arm position value $X_O$ that is the origin of the coordinate of travel was linearly increasing and a speed value V remained constant, namely, the robot arm was controlled to linearly run at a constant speed, and it is understood that a displacement angle of the pitching direction "q" became larger. This means that the position of the hand at the free end of the robot arm went down, thus resulting in an increased possibility of the arm making contact with a fixed portion. This was caused because the position of the centroid of the robot arm moved forward in the running direction "x".

On the other hand, in FIG. 8, even though the arm position value $X_O$ was linearly increasing and the speed value V remained constant, which is similar to the case of FIG. 7, a displacement angle in the pitching direction "q" was reduced in comparison with that in FIG. 7. It is understood from the fact that the changes in the centroid position caused by the movement of the robot arm can be compensated by the feed-forward control using the arm position value $X_O$.

In this way, the control method which supplies the compensation value $\Delta$Iq" proportional to the arm position value $X_O$ to the q-control system to practice the feed-forward control is found to be extremely effective in controlling the posture of an elongated robot arm used with a non-contact linear actuator.

Further, it is understood from the results illustrated in FIGS. 7 and 8 that the employment of the feed-forward control effectively reduces fluctuations in other controlled amounts, whereas the absence of the feed-forward control causes larger displacement fluctuation thereof.

Generally, a linear actuator has an elongated plate-like flexible arm for reducing the weight. If flexible natural vibrations of the arm are introduced into a feedback loop in a levitation-posture control system, the levitation-posture control for the arm will be adversely affected, as described above with reference to a prior art. To avoid this inconvenience, the arm vibrations should be eliminated or reduced.

Next, it will be explained a vibration removing mechanism for removing such flexible vibrations of an arm.

Flexible vibrations of an elongated plate-like flexible arm are estimated to appear in the "z" (levitation), "p" (roll), and "q" (pitch) control systems. First, paying attention to the first-order flexible mode of the arm, relative positional relationships between vibrations in a natural vibration mode which are mainly caused in the z-direction and the q-direction due to movements of the arm, and levitation control forces will be considered. FIGS. 9(A)–9(F) illustrate relationships between the variations in the first-order flexible mode appeared on the arm 2 and electromagnetic forces in the "z" and "q" control systems. In the drawings, solid and broken arrows represent the electromagnetic forces, and $X_O$ indicates the arm position value from the center of the linear actuator.

Figure 9A:
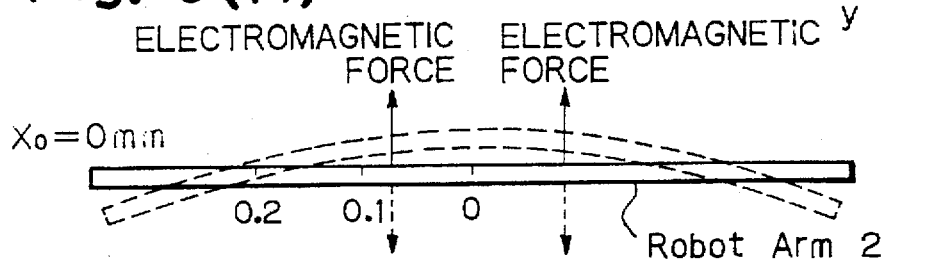
FIGS. 9(A)–9(F) illustrate diagrams for explaining relationships between vibrations in the first-order flexible mode and electromagnetic forces in relation to moving amounts (or position values) of a robot arm.
Figure 9B:
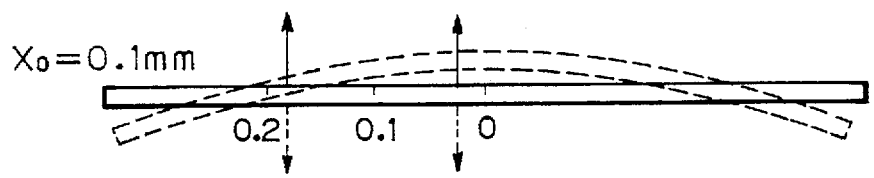
Figure 9C:
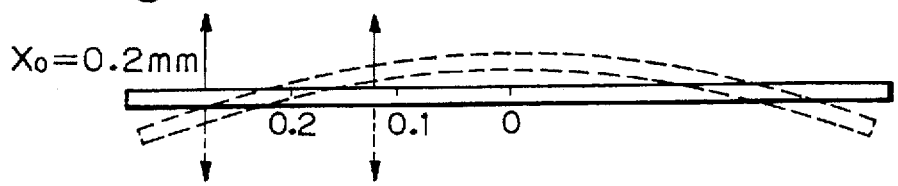

In the "z" control system for the arm 2 as a rigid body, four pairs of the electromagnets ($11_{1u}$–$11_{4u}$ and $11_{1d}$–$11_{4d}$ in FIG. 3) all generate control forces in the same z-direction to levitate the arm as shown in FIGS. 9(A)–9(C). Assume that when $X_O=0$ (m), such a control law is employed such that the electromagnets on the front and back sides of the arm 2 apply magnetic attractive forces to the arm in the same phase as that of the vibration in the flexible bending natural mode. Since the electromagnets on the both sides are in the same phase with respect to the flexible bending natural mode, the electromagnets on both sides act to excite or accelerate the vibration in the mode. Similarly, in the case of $X_O=0.1$ (m) shown in FIG. 9(B), the vibration in the flexible bending natural mode is excited by the electromagnet forces.

To prevent this from occurring, it is necessary to set the phase of the control forces having frequencies in the vicinity of the flexible bending natural mode of the arm, opposite to that of the flexible bending natural vibration at the above arm positions, or $X_O=0$ (m) and $X^O=0.1$ (m).

In contrast, at the arm position of $X_O=0.2$ (m) shown in FIG. 9(C), since the electromagnets on the front and back sides apply magnetic attractive forces to the arm in opposite phase to that of the flexible bending natural vibration of the arm, the vibration is not excited.

Figure 9D:
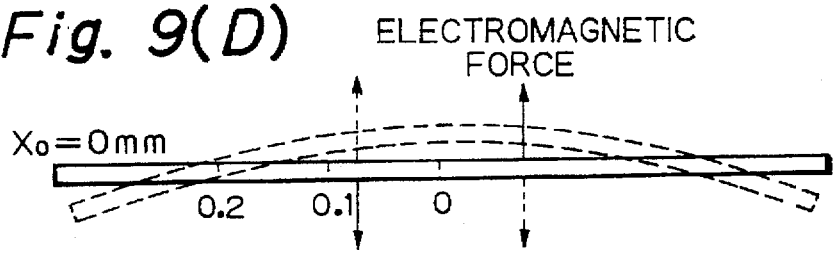
Figure 9E:
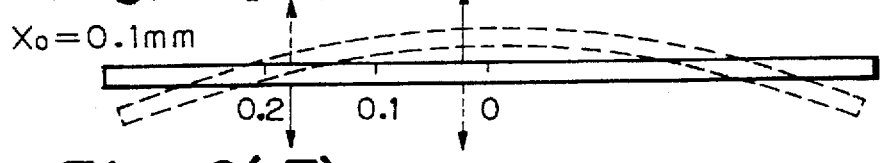
Figure 9F:
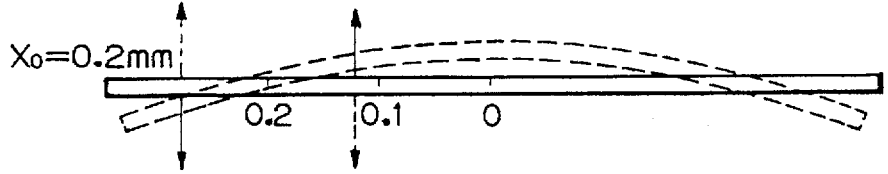

In the "q" (pitching) control system, as shown in FIGS. 9(D)–9(F), the electromagnets on the front and back sides apply magnetic attractive forces to the arm in the opposite phase to each other to control a rigid pitching vibration of the arm. According to the control law, at $X_O=0$ (m) and $X_O=0.1$ shown in FIGS. 9(D) and 9(E), the electromagnets on the front and back sides of the arm bring the forces opposite in phase to the vibration of the arm in the first-order flexible vibration mode, and thus they do not act to excite the vibration.

On the other hand, when $X_O=0.2$ (m) shown in FIG. 9(F), since the electromagnets on the front and back sides apply magnetic attractive forces to the arm in anti-phases of the flexible bending natural vibration of the arm to control the rigid pitching motion, they excite the natural vibration of the arm. To prevent this from occurring, it is necessary to set the phases of the control forces having frequencies in the vicinity of the flexible bending natural frequency of the arm, to be in opposition to the phase of the natural frequency.

As to the "p" (rolling) control system, control forces provided from the left-side and right-side electromagnets to the arm mutually have opposite phases to control a rigid rolling motion of the arm. Therefore, even if the arm is moving, the control forces for the rigid rolling motion do not excite the first-order flexible vibration mode.

The same applies to second-order and fourth-order natural vibration modes with reference to the "z", "p", and "q" control systems.

As to a third-order natural vibration mode, a vibration is caused to vibrate in the left and right directions of the arm (or, the orthogonal directions to the running direction "x" of the arm). Accordingly, at any moving position, the rigid control systems in the z-direction and q-direction do not excite this vibration mode. However, in the p-direction control system, as the moving amount $X_0$ of the arm increases, the third-order elastic vibration mode is more susceptible to the excitation by the control forces.

In consideration of the forgoing, the following Table 1 is obtained which shows resonance characteristics with regard to the flexible natural vibration modes of the arm, arm moving amount $X_0$ (meter), and rigid motion control directions (or posture directions "z", "p", "q"), and excitation of natural vibration. In the Table, "o" shows that at least a resonance peak is caused by an excitement of electromagnet forces, while "x" shows that no resonance peak is caused thereby.

TABLE 1

Resonance Characteristics
Predicted from Vibration Mode Analysis

| Direction | $X_0$ (m) | 1st mode | 2nd mode | 3rd mode | 4th mode |
|---|---|---|---|---|---|
| z | 0 | o | x | x | o |
|   | 0.1 | o | o | x | x |
|   | 0.2 | x | o | x | o |
| p | 0 | x | x | x | x |
|   | 0.1 | x | x | o | x |
|   | 0.2 | x | x | o | x |
| q | 0 | x | o | x | x |
|   | 0.1 | o | x | x | o |
|   | 0.2 | o | o | x | x |

To prevent the excitation of any flexible vibration mode occurring as the arm moves, the notch filters 20z, 20p, and 20q having natural vibration frequencies in the flexible modes are inserted after the PID circuits 17z, 17p and 17q incorporated in the "z", "p", "q" control systems to prevent the oscillation, provided that instead of providing notch filters corresponding to all natural frequencies in the whole control systems, only the notch filters for the natural frequencies at which the excitation of the vibration is predicted to be highly possible in view of the Table are utilized.

Since the first-order flexible natural frequency of the arm is relatively low, it is controlled by a phase-lead compensation in the levitation PID control. The second, third and fourth-order natural frequencies are attenuated by the notch filters 20z, 20p and 20q.

With regard to the "z" control system, the excitations of the vibrations are predictable at the second- and fourth-order natural frequencies from the Table 1. Accordingly, the notch filter 20z inserted after the PID circuit 17z in FIG. 5(A) is arranged to have the second-order and fourth-order natural frequencies as notch frequencies. Regarding the "q" control system, the vibration excitations are predicted from the Table 1 at the same frequencies as those in the z-control system, and thus the notch filter 12q is also arranged to have the same notch frequencies as those of the notch filter 26z.

As to the "p" control system, since the vibration excitations are predicted at the third-order natural frequency with reference to the Table 1, the notch filter 26p inserted after the PID circuit 17p is arranged to have the third-order natural frequency as the notch frequency.

To examine the influences of the vibration modes of an object arm and the respective posture controls for the arm, frequency characteristics of the arm were measured, without employing the notch filters 26z, 26p, and 26q in the control system shown in FIG. 5, and without using the arm position $X_0$ as a parameter. The results of measurements in the z-direction are shown in FIG. 10. In the graphs of FIG. 10, solid lines represent measured frequency characteristics, and broken lines represent frequency characteristics derived when second-order delay elements of a detecting section of the system are considered in a mathematical model.

Figure 10A:
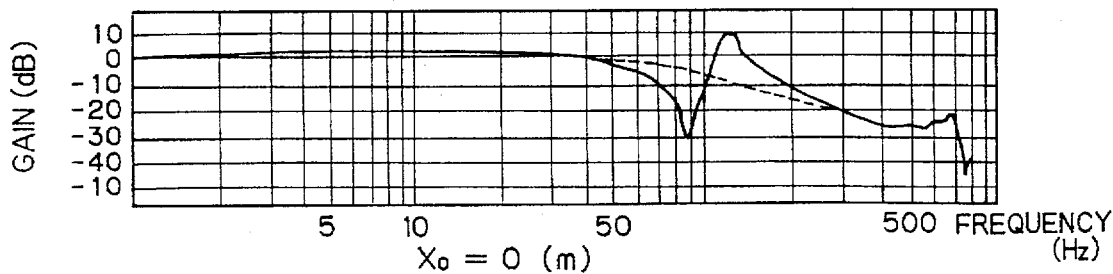
FIGS. 10(A)–10(D) show graphs of frequency characteristics of a robot arm in a levitation direction "z" in relation to moving amounts of the robot arm.
Figure 10B:
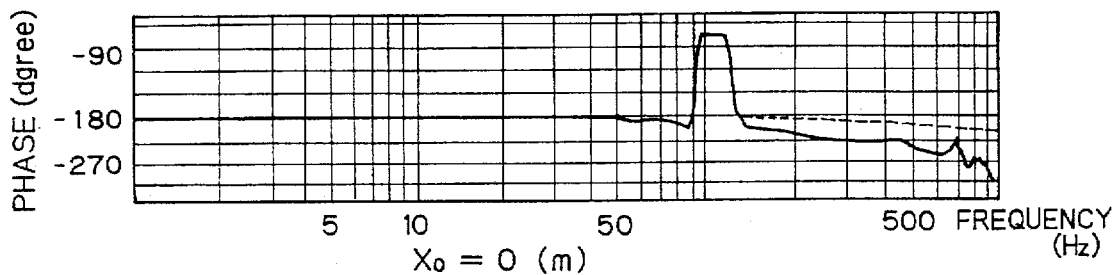
Figure 10C:
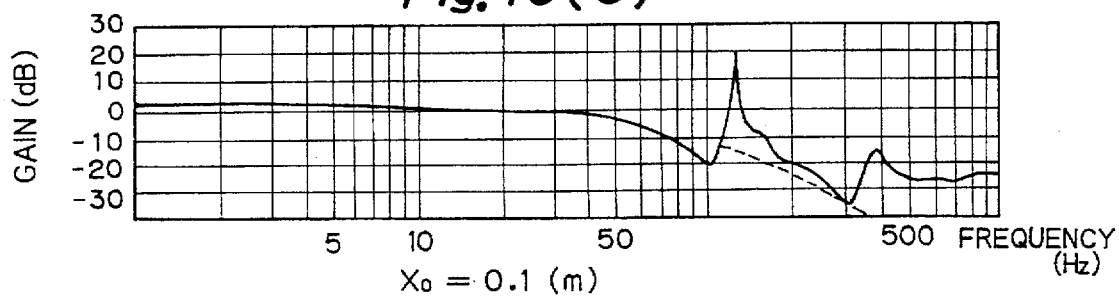
Figure 10D:
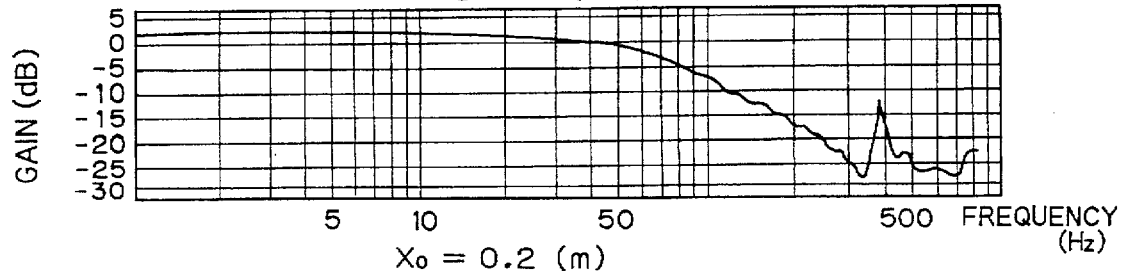

From FIGS. 10(A)–10(D), it is observed that in the z-direction, a resonance peak exists in the vicinity of the first-order flexible natural frequency when $X_0$ is 0 (m); resonance peaks exist in the vicinities of the first-order and second-order natural frequencies when $X_0$ is 0.1 (m); and a resonance peak exists in the vicinity of the natural second-order frequency when $X_0$ is 0.2 (m). The resonance peaks appear as shown in the foregoing Table 1. That is, the resonance peaks depending on the arm position $X_0$ in FIGS. 10(A)–10(C) are found substantially at the "o" marked first-order and second-order modes in the Table 1. It is understood from the foregoing that the flexible vibration of the arm directly exerts adverse influences on the levitation control system.

As illustrated in FIGS. 10(A), 10(B), the resonance peaks, which are formed due to the first-order natural vibration of the arm, are extremely close to a cross-over frequency of the feedback control system (or the frequency at which the gain characteristics intersect with the 0 dB line).

If a notch filter is used only for the first-order natural frequency as a vibration excitement preventing means, although the peak of the first-order natural vibration mode can be lowered, the phase at the cross-over frequency is delayed by the notch filter, thus resulting in an unstable feedback control system.

Further, if the gain of the control system is reduced to lower the cross-over frequency, a phase-lead-compensation can be carried out and the first-order natural frequency can be separated from the cross-over frequency. However, a reduced gain will result in a larger steady-state error in the z-control system and the q-control system, and consequently, the whole feedback control system becomes unstable.

In the embodiment, the feed-forward control as explained with reference to FIG. 6 is added to the q-feedback control system to stabilize the whole control system as well as to avoid the influence exerted by the first-order natural frequency without using notch filters for the first-order natural frequency which is close to the cross-over frequency.

The foregoing embodiment has been described in connection with an actuator for linearly driving a robot arm levitated and supported by linear magnetic bearings in a vacuum environment which is suitable for a semiconductor manufacturing process. However, it should be noted that the gist of the present invention can be widely applied to any linear actuator which levitates and supports an elongated plate-like arm, and drives the same in a non-contact manner.

The following advantages can be derived from the present invention:

(1) In a linear actuator associated with a clean robot used in a vacuum environment, by providing the additional feed-forward control system for applying the moving amount (or position value) of the arm in the q-feedback control system, the control of the arm in the q-direction is significantly stabilized, even if the position of the centroid of the arm fluctuates due to the running thereof, without incurring the problem of oscillation.

(2) For preventing the flexible natural vibrations of the arm from being introduced into the posture control system, by adding a minimally required number of notch filters for removing the flexible natural vibrations of the arm to the levitation-posture control PID system, the flexible vibrations of the arm, which would exert adverse influences on the arm posture control, are reduced.

Although the description has been made by assuming that the control system according to the present invention is applied to the linear actuator shown in FIG. 3, it should be understood that the present invention is applicable to any linear actuator in which a robot arm is linearly driven in a non-contact state in a running direction and a levitation posture thereof is controlled in response to gap and stagger lengths between electromagnets of the actuator and the arm. Further, it is to be understood that modifications will be apparent to those skilled in the art without departing from the spirit of the invention.

What is claimed is:

1. A control system for controlling a linear actuator which includes a plurality of magnetic bearings for levitating and supporting a robot arm and a pulse motor for linearly driving said robot arm in a non-contact manner, said control system comprising;

displacement detection means for detecting displacement values of said robot arm from a reference posture:

first calculation means, in response to said displacement values, for calculating guiding (y), levitation (z), roll (p), pitching (q), and yaw (r) control current values and providing guiding, levitation, roll, pitching, and yaw control current signals ($\widehat{\Delta Iy}$, $\widehat{\Delta Iz}$, $\widehat{\Delta Ip}$, $\widehat{\Delta Iq}$, $\widehat{\Delta Ir}$);

moving amount detecting means for detecting a moving amount ($X_o$) of said robot arm from a reference position in response to an operation of said pulse motor, and providing a compensation current value ($\Delta Iq''$) proportional to said moving amount;

adding means for adding said compensation current value ($\Delta Iq''$) to said pitching control current signal ($\widehat{\Delta Iq}$); and second calculation means, in response to said guiding, levitation, roll and yaw control current signals ($\widehat{\Delta Iy}$, $\widehat{\Delta Iz}$, $\widehat{\Delta Ip}$, $\widehat{\Delta Ir}$) and the added pitching control current signal ($\widehat{\Delta Iq}+\Delta Iq''$), for calculating drive current control values to compensate drive current flowing through said magnetic bearings, whereby a control for the pitching direction is executed in accordance with said moving amount of said robot arm to prevent said robot arm from inclination caused by the movement of said robot arm.

2. A control system according to claim 1, further comprising:

notch filter means for attenuating frequencies contained in the levitation, roll, pitching control current signals ($\widehat{\Delta Iz}$, $\widehat{\Delta Ip}$, $\widehat{\Delta Iq}$), the frequencies corresponding to the flexible natural variation frequencies of said robot arm in a running (x) direction, whereby the flexible natural variations of said robot arm is prevented from excitation by the feedback control.

3. A control system according to claim 1, wherein said magnetic bearings comprises four pairs of upper and lower electromagnets positioned at front-right front-left, back-right and back-left portions which sandwich said robot arm in non-contact states, and said displacement detection means comprises:

four pairs of upper and lower displacement sensors positioned near to said electromagnets for sensing gap and stagger lengths between said robot arm and said electromagnets; and calculation means in response to said gap and stagger lengths, for calculating displacement values in the guiding and levitation directions at the portions of said robot arm where the front and back electromagnets face.

4. A control system according to claim 2, wherein said magnetic bearings comprises four pairs of upper and lower electromagnets positioned at front-right front-left, back-right and back-left portions which sandwich said robot arm in non-contact states, and said displacement detection means comprises:

four pairs of upper and lower displacement sensors positioned near to said electromagnets for sensing gap and stagger lengths between said robot arm and said electromagnets; and calculation means in response to said gap and stagger lengths, for calculating displacement values in the guiding and levitation directions at the portions of said robot arm where the front and back electromagnets face.

5. A control system for controlling a linear actuator which includes a plurality of magnetic bearings for levitating and supporting a robot arm having a hand at one end thereof and a pulse motor for linearly driving said robot arm in a non-contact manner, said control system comprising;

displacement detection means for detecting displacement values of said robot arm from a reference posture;

first calculation means, in response to said displacement values, for calculating guiding (y), levitation (z), roll (p), pitching (q), and yaw (r) control current values and providing guiding, levitation, roll, pitching, and yaw control current signals ($\widehat{\Delta Iy}$, $\widehat{\Delta Iz}$, $\widehat{\Delta Ip}$, $\widehat{\Delta Iq}$, $\widehat{\Delta Ir}$;

notch filter means for attenuating frequencies contained in the levitation, roll, pitching control current signals ($\widehat{\Delta Iz}$, $\widehat{\Delta Ip}$, $\widehat{\Delta Iq}$), the frequencies corresponding to the flexible natural variation frequencies of said robot arm in a running (x) direction; and second calculation means, in response to said guiding and yaw control current signals ($\widehat{\Delta Iy}$, $\widehat{\Delta Ir}$) and the filtered levitation, roll and pitching control current signals ($\widehat{\Delta Iz}$, $\widehat{\Delta Ip}$, $\widehat{\Delta Iq}$), for calculating drive current control values to compensate drive current flowing through said magnetic bearings, whereby the flexible natural variations of said robot arm is prevented from excitation.

6. A control system according to claim 5, wherein said magnetic bearings comprises four pairs of upper and lower electromagnets positioned at front-right front-left, back-right and back-left portions which sandwich said robot arm in non-contact states, and said displacement detection means comprises:

four pairs of upper and lower displacement sensors positioned near to said electromagnets for sensing gap and stagger lengths between said robot arm and said electromagnets; and calculation means in response to said gap and stagger lengths, for calculating displacement values in the guiding and levitation directions at the portions of said robot arm where the front and back electromagnets face.

* * * * *